United States Patent
Jin et al.

(10) Patent No.: US 11,355,943 B2
(45) Date of Patent: Jun. 7, 2022

(54) BATTERY MANAGEMENT APPARATUS FOR VEHICLE AND METHOD OF THE SAME

(71) Applicants: HYUNDAI MOTOR COMPANY, Seoul (KR); KIA MOTORS CORPORATION, Seoul (KR)

(72) Inventors: Jae Eun Jin, Incheon (KR); Junhyeong Park, Daejeon (KR); Jinyong Shim, Asan-si (KR); Ki Seon Ryu, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 132 days.

(21) Appl. No.: 16/816,750

(22) Filed: Mar. 12, 2020

(65) Prior Publication Data
US 2021/0091582 A1  Mar. 25, 2021

(30) Foreign Application Priority Data
Sep. 24, 2019  (KR) .................... 10-2019-0117230

(51) Int. Cl.
| | |
|---|---|
| H02J 7/00 | (2006.01) |
| H02J 7/14 | (2006.01) |
| G01R 31/36 | (2020.01) |
| F02B 63/04 | (2006.01) |
| G01R 31/3828 | (2019.01) |
| B60R 16/033 | (2006.01) |

(52) U.S. Cl.
CPC .......... *H02J 7/0048* (2020.01); *B60R 16/033* (2013.01); *F02B 63/042* (2013.01); *G01R 31/3648* (2013.01); *G01R 31/3828* (2019.01); *H02J 7/14* (2013.01)

(58) Field of Classification Search
CPC ..................................................... H02J 7/0048
USPC ......................................................... 320/134
See application file for complete search history.

(56) References Cited

U.S. PATENT DOCUMENTS

| | | | |
|---|---|---|---|
| 6,359,419 B1* | 3/2002 | Verbrugge .............. | B60L 58/18 320/132 |
| 2003/0090272 A1* | 5/2003 | Bertness .............. | G01R 31/385 324/426 |

(Continued)

*Primary Examiner* — Yalkew Fantu
(74) *Attorney, Agent, or Firm* — McDonnell Boehnen Hulbert & Berghoff LLP

(57) ABSTRACT

A battery management apparatus for a vehicle includes a battery, an alternator, a battery detection unit, a battery controller generating an initial state of charge by using initial state information of the battery at startup, generating an internal resistance of the battery using a voltage value and a current value of the battery, generating a first state of charge by using a driving state information of the battery, a battery charging efficiency, and the initial state of charge when the startup is off, generating a second state of charge by using the off state information of the battery when the off time after the start-off is greater than or equal to the reference time, and resetting the battery charging efficiency based on the first and second state of charge, and a vehicle controller for receiving the battery charging efficiency from the battery controller, and controlling the alternator based thereon to charge the battery.

13 Claims, 5 Drawing Sheets

(56) References Cited

U.S. PATENT DOCUMENTS

2011/0078092 A1* 3/2011 Kim .................. B60L 53/65
            705/412
2015/0329003 A1* 11/2015 Li .................... B60L 53/66
            320/134
2017/0264104 A1* 9/2017 Horitake ............ B60R 16/033

* cited by examiner

BATTERY MANAGEMENT APPARATUS FOR VEHICLE AND METHOD OF THE SAME

CROSS REFERENCE TO RELATED APPLICATIONS

This application claims priority to and the benefit of Korean Patent Application No. 10-2019-0117230 filed in the Korean Intellectual Property Office on Sep. 24, 2019, the entire contents of which are incorporated herein by reference.

BACKGROUND

(a) Field

The present disclosure relates to a battery management apparatus for vehicle, more particularly, to a battery management apparatus for vehicle and method of the same that can check status of the battery and control the charging and discharging of the battery according to the status.

(b) Description of the Related Art

Typically, a vehicle is equipped with a starting device for an engine, an electronic device for an ignition device, and many electric devices (i.e., electric loads) such as a headlight, a radio, an air conditioner, a navigation device, front and rear surveillance cameras, and the like. The vehicle is equipped with a battery and an alternator as a power source for supplying electric power to the electric load.

In general, a battery for supplying electric power to the electric load is a low voltage battery (e.g., a 12V battery), and lead-acid batteries are mainly used.

The lead-acid batteries are inferior to lithium batteries in terms of durability and fuel economy, but they have been the mainstream of batteries since they are relatively inexpensive in terms of cost.

As such, batteries are widely used in various functions for improving fuel efficiency from auxiliary functions for operating electric loads such as headlights and air conditioners, it is necessary to develop a technology for predicting the aging of batteries.

However, it is difficult to determine the aging state of the battery due to the nature of the environment applied. That is, since the battery is always connected to the load, there is no no-load state, and it is difficult to determine the aging state of the battery because it is difficult to be charged using a constant current for a certain time by the changing load.

In addition, in the conventional case, since the state of the battery cannot be monitored while driving, it is not possible to confirm the aging degree and performance change of the battery, thereby providing the driver with inconvenience such as inability to start.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide a battery management apparatus for vehicle and method of the same that can monitor the status of charge and aging of the battery while driving.

Further, an exemplary embodiment of the present disclosure provides a battery management apparatus for vehicle and method of the same that can check the status of aging of the battery, and can control the charging and discharging of the battery according to the status of aging of the battery.

A battery management apparatus for a vehicle according to an exemplary embodiment of the present disclosure includes a battery for supplying current to a plurality of electric loads mounted on the vehicle, an alternator for supplying current to the battery and the plurality of electric loads, a battery detection unit for detecting the state information of the battery, a battery controller generating an initial state of charge by using initial state information of the battery at startup, generating an internal resistance of the battery using a voltage value and a current value of the battery, generating a first state of charge by using a driving state information of the battery, a battery charging efficiency, and the initial state of charge when the startup is off, generating a second state of charge by using the off state information of the battery when the off time after the start-off is greater than or equal to the reference time, and resetting the battery charging efficiency based on the first state of charge and the second state of charge, and a vehicle controller for receiving the battery charging efficiency from the battery controller, and controlling the alternator based on the battery charging efficiency to charge the battery.

Further, the battery controller may generate an integrated current value while the vehicle is driven based on the current value included in the driving state information when the vehicle is turned off, and generates a first state of charge using the current integrated value, the initial state of charge, and the battery capacity.

Further, the battery controller may generate a charge current integrated value in which a current is accumulated for a time when the current is supplied to the battery from the time when the start is turned on to the time when the start is turned off, and a discharge current integrated value in which a current is accumulated for a time when the current is subtracted from the battery from the time when the start is turned on to the time when the start is turned off.

Further, the battery controller may check a voltage value of the battery included in the off state information when the off time after the start-off is greater than or equal to a set time and generate the second charged state based on the voltage value.

Further, the battery controller may reset the battery charging efficiency if a difference value between the first state of charge and the second state of charge is equal to or greater than a set value.

Further, the battery controller may generate battery replacement notification information when the internal resistance is greater than or equal to a reference value compared to an initial internal resistance or the battery charging efficiency is less than or equal to a set efficiency.

Further, the battery management apparatus for vehicle may further include an output unit for outputting the battery replacement notification information.

Further, the battery management apparatus for vehicle may further include a storage unit storing at least one of state information detected by the battery detector, an initial state of charge, a first state of charge, a second state of charge, and a battery charge efficiency generated by the battery controller.

In another exemplary embodiment of the present disclosure, a battery management method is disclosed for a vehicle including a battery for supplying current to a plurality of electric loads mounted on the vehicle, and an alternator for supplying current generated by power of an engine to the battery and the plurality of electric loads includes generating an initial state of charge of the battery using the voltage value after checking a voltage value of the battery at startup, generating an internal resistance of the battery using the voltage value and the current, generating a first state of charge by using the initial state of charge, driving state information, and the battery charging efficiency after checking the driving state information of the battery when the startup is off, determining whether the off time after the start-off is greater than or equal to the reference, generating a second state of charge using the voltage value after checking a voltage value of the battery when the off time is greater than or equal to the reference time, and resetting the battery charging efficiency if the difference value is equal to or greater than a set value after checking a difference value between the first state of charge and the second state of charge.

According to an exemplary embodiment of the present disclosure, since the state of charge and aging of the battery may be monitored while driving the vehicle, the durability of the battery may be increased.

Further, the aging state of the battery may be checked, and the charging and discharging of the battery may be controlled according to the aging state of the battery, therefore, fuel consumption can be minimized to improve fuel economy and to improve operator comfort.

In addition, an effect that can obtain or that is estimated with an exemplary embodiment of the present disclosure is directly or suggestively described in a detailed description of an exemplary embodiment of the present disclosure. That is, various effects that are estimated according to an exemplary embodiment of the present disclosure will be described within a detailed description to be described later.

DETAILED DESCRIPTION

Hereinafter, an operation principle of a method and apparatus for controlling regenerative braking of a vehicle according to an exemplary embodiment of the present disclosure will be described in detail with reference to the accompanying drawings. However, drawings and a detailed description to be described later relate to an exemplary embodiment of several exemplary embodiments for effectively describing a characteristic of the present disclosure. Therefore, the present disclosure is not limited to only the following drawing and description.

Further, detailed descriptions of well-known functions and structures incorporated herein may be omitted to avoid obscuring the subject matter of the present disclosure. The terms used herein are defined according to the functions of the present disclosure and may vary depending on a user's or an operator's intension and usage. Therefore, the terms used herein should be understood based on the descriptions made herein.

Further, in order to effectively describe technical characteristics of the present disclosure, the following exemplary embodiment may appropriately change, integrate, or separate terms to be clearly understood by a person of ordinary skill in the art and the present disclosure is not limited thereto.

Hereinafter, an exemplary embodiment of the present disclosure will be described in detail with reference to the accompanying drawings.

Figure 1:
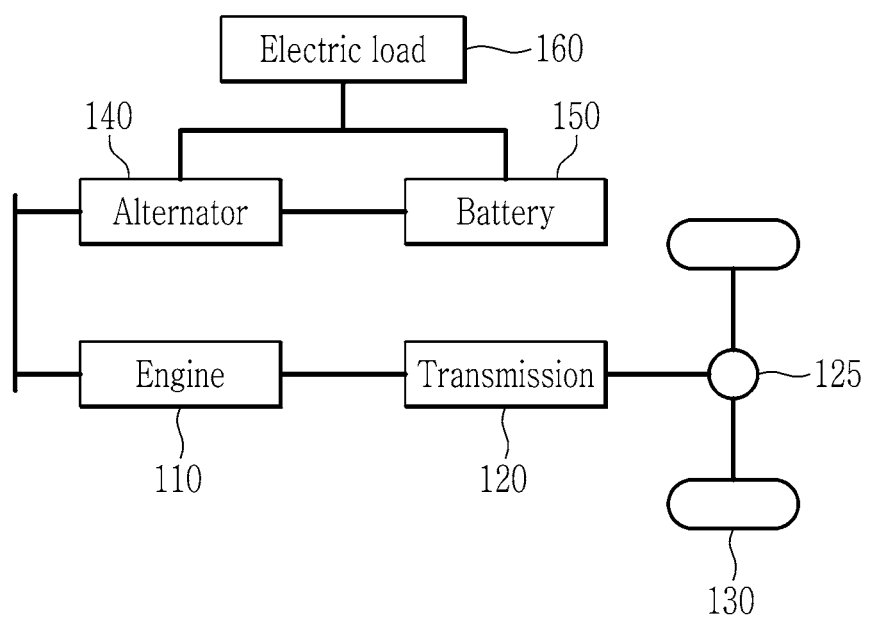
FIG. 1 is a block diagram illustrating a vehicle to which a battery management apparatus according to an exemplary embodiment of the present disclosure is applied.

FIG. 1 is a block diagram illustrating a vehicle to which a battery management apparatus according to an exemplary embodiment of the present disclosure is applied.

Referring to FIG. 1, a vehicle includes an engine 110, a transmission 120, a differential gear device 125, a driving wheel 130, an alternator 140, a battery 150, and an electric load 160.

The engine 110 burns fuel to produce torque. That is, the engine 110 burns fuel and air to convert chemical energy into mechanical energy.

The engine 110 may be a variety of known engines, such as gasoline engine, diesel engine, or a liquefied petroleum injection (LPI) engine.

In the power transmission of the vehicle, the torque of the engine 110 is transmitted to the input shaft of the transmission 120, and the torque output from the output shaft of the transmission 120 is transmitted to the axle via the differential gear device 125. As the axle rotates the driving wheel 130, the vehicle is driven by the torque of the engine 110.

The transmission 120 transmits the torque of the engine 110 to the driving wheel 130 to allow the vehicle to travel.

The transmission 120 may be an automatic transmission or a manual transmission.

The automatic transmission controls the hydraulic pressure by driving a plurality of solenoid valves according to the speed of the vehicle and the position of the accelerator pedal, so that the shift gear of the target gear stage is operated to automatically shift.

The manual transmission is shifted by the driver's operation by depressing the clutch pedal and moving the gear lever to the desired gear stage.

The alternator 140 generates electric current by the power of the engine 110. The alternator 140 supplies current to the plurality of electric loads 160 and supplies surplus current to the battery 150 as charging current.

The battery 150 may be a low voltage battery 150. For example, the battery 150 may be a 12V lead acid battery 150.

The battery 150 supplies a current required for starting the vehicle, or supplies a current required by the electric load. That is, the battery 150 supplies current when the engine 110 starts up and restarts. The battery 150 supplies a plurality of electric loads 160 with the electric current stored at the time of acceleration, constant speed, and idling of which the generation amount of the alternator 140 is low.

The electric load 160 includes a plurality of components mounted in a vehicle and driven by a current supplied from the alternator 140 or the battery 150. For example, the electric load 160 may include an air conditioner, a radio, navigation, front and rear cameras, wipers, headlights, hot wires, and the like.

Figure 2:
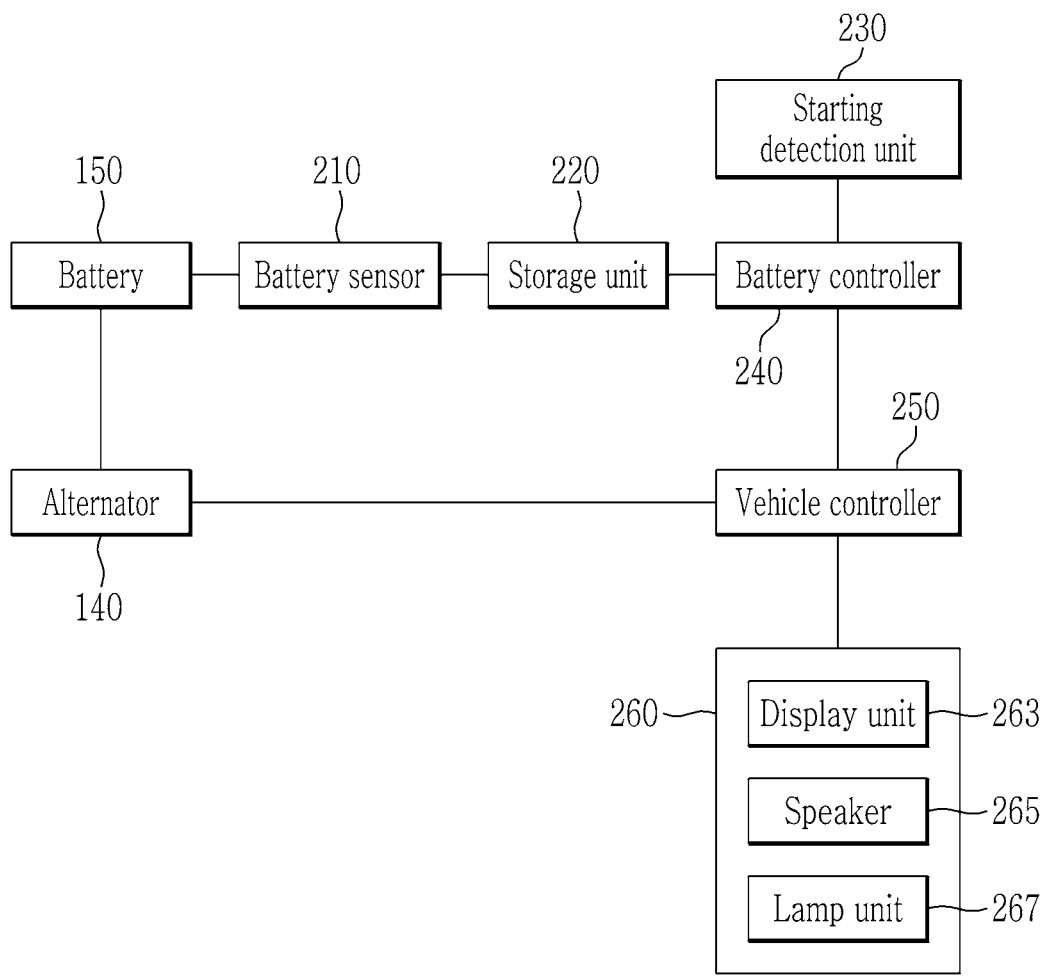
FIG. 2 is a block diagram illustrating a battery management apparatus according to an exemplary embodiment of the present disclosure.

FIG. 2 is a block diagram illustrating a battery management apparatus according to an exemplary embodiment of the present disclosure.

Referring to FIG. 2, the battery management apparatus includes a battery 150, an alternator 140, a battery sensor 210, a storage unit 220, a starting detection unit 230, a battery controller 240, a vehicle controller 250, and an output unit 260.

The battery 150 receives current from the alternator 140 and charges the battery 150, and discharges the battery 150 by supplying current to the plurality of electric loads 160.

The alternator 140 adjusts the amount of power generated under the control of the vehicle controller 250.

The battery sensor 210 detects state information including voltage, current, temperature, and the like of the battery 150.

The battery sensor 210 may detect state information under the control of the battery controller 240, or detect the state information at a predetermined time. The battery sensor 210 may detect the state information differently while driving, when the vehicle is in a parking state after starting off.

The battery sensor 210 provides the detected state information to the storage unit 220.

The storage unit 220 generates or stores necessary information in the components of the battery management apparatus. That is, the storage unit 220 stores the state information detected by the battery sensor 210.

In addition, the storage unit 220 stores the information generated by the battery controller 240. For example, the storage unit 220 may store the state of charge (hereinafter referred to collectively as SoC), battery charging efficiency, internal resistance, and the like of the battery 150 generated by the battery controller 240.

The starting detection unit 230 detects information on start on and off of the engine 110 and provides the detected start information to the battery controller 240.

The battery controller 240 receives information detected by the battery sensor 210 from the storage unit 220 and generates an SoC of the battery 150 based on the received information. The battery controller 240 resets the battery charging efficiency based on the SoC of the battery 150 and provides the reset battery charging efficiency to the vehicle controller 250. The battery controller 240 may be an intelligent battery unit (IBU).

In detail, the battery controller 240 is provided with startup information from the startup detector 230. The battery controller 240 checks the startup of the engine 110 based on the start information, and generates an initial SoC by using the initial state information of the battery 150 at the startup. The battery controller 240 generates an internal resistance (IR) of the battery 150 using the voltage value and the current value of the battery 150 at startup.

The battery controller 240 generates a driving SoC of the battery 150 based on driving state information of the battery 150 while driving.

The battery controller 240 receives the start information from the start detector 230 and checks the start-off of the engine 110 based on the start information. The battery controller 240 generates a first SoC by using driving state information, battery charging efficiency, and initial charging state of the battery 150 at startup.

The battery controller 240 generates a second SoC by using the off state information of the battery 150 when the off time after the start-off is greater than or equal to the reference time.

The battery controller 240 resets the battery charging efficiency based on the first SoC and the second SoC. The battery controller 240 provides the reset battery charging efficiency to the vehicle controller 250.

The battery controller 240 may be implemented by one or more microprocessors which are operated by a set program, and the set program may include a series of instructions for performing the respective steps included in the battery management method for vehicle according to an exemplary embodiment of the present disclosure to be described below. Such a battery controller will be described in more detail with reference to FIG. 3.

In FIG. 2, the battery controller 240 is connected to the battery sensor 210 through the storage unit 220 as an example, but is not limited thereto, the battery controller 240 may be directly connected to the battery sensor 210 to control the battery sensor 210.

The vehicle controller 250 controls the battery controller 240 and the alternator 140 which are components of the battery management apparatus.

In other words, the vehicle controller 250 receives battery charging efficiency from the battery controller 240. The vehicle controller 250 controls the alternator 140 to charge the battery 150 based on the battery charging efficiency.

The vehicle controller 250 may be an electronic control unit (ECU).

The output unit 260 outputs battery replacement notification information under the control of the vehicle controller 250. Meanwhile, the output unit 260 will be described as an example to output the battery replacement notification information under the control of the vehicle controller 250, but is not limited thereto, the battery replacement notification information may be output under the control of the battery controller 240.

The output unit 260 may include at least one of a display unit 263, a speaker 265, and a lamp unit 267.

The display unit 263 displays the battery replacement notification information through a text or a picture. The display unit 263 is irrelevant as long as it can display the battery replacement notification information. For example, the display unit 263 may be any one of a communication terminal such as a driver's mobile phone and a tablet PC, a cluster, and a navigation device.

The speaker 265 outputs battery replacement notification information through sound.

The lamp unit 267 outputs battery replacement notification information through light. For example, the lamp unit 267 may notify the driver by outputting a red light when the battery 150 needs to be replaced. This color may be set by a preset rule or set by an operator.

Hereinafter, a battery management method according to the present disclosure will be described with reference to FIGS. 3 to 5.

Figure 3:
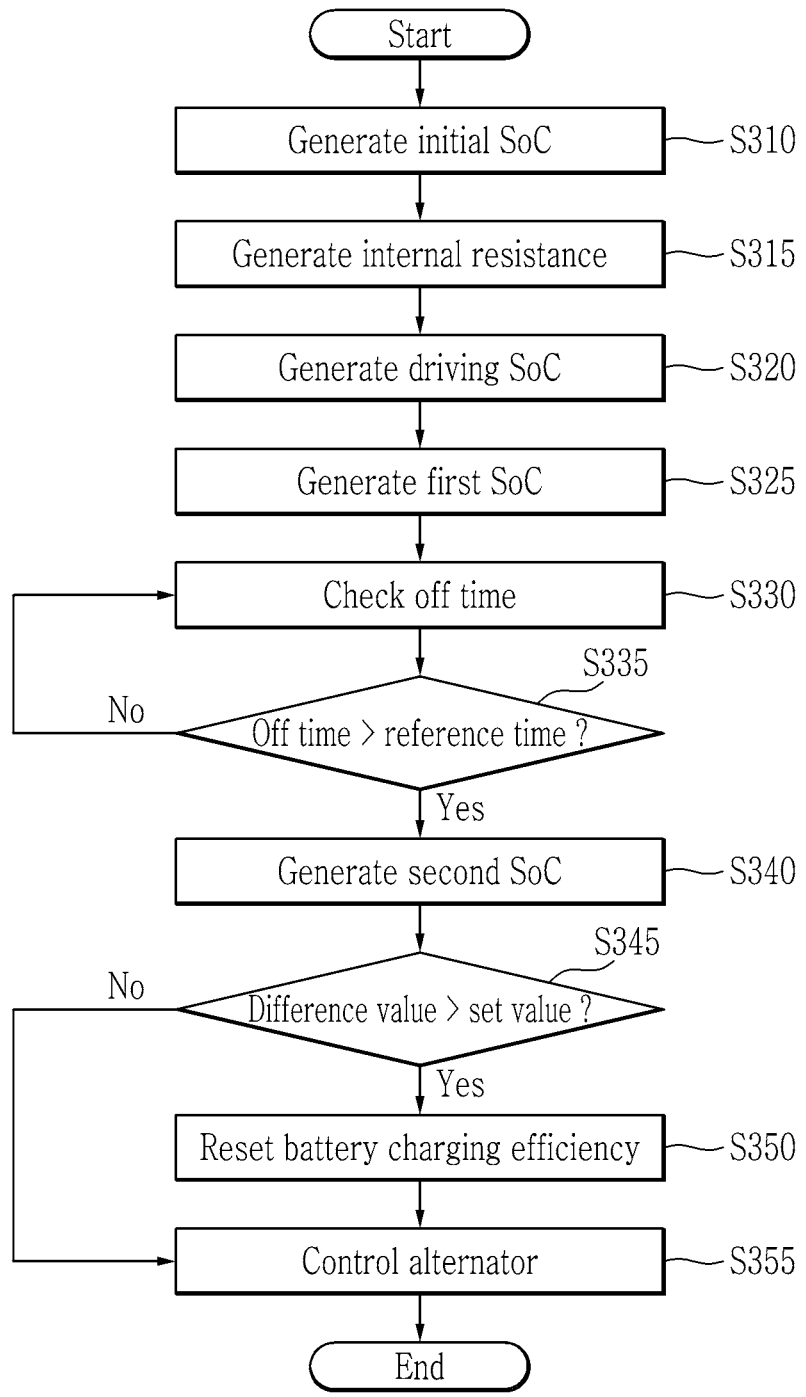
FIG. 3 is a flowchart illustrating a battery management method according to an exemplary embodiment of the present disclosure.

FIG. 3 is a flowchart illustrating a battery management method according to an exemplary embodiment of the present disclosure.

Referring to FIG. 3, the battery controller 240 generates an initial SoC by using initial state information of the battery 150 at start-up at S310.

In detail, when the engine 110 is started on, the start detector 230 generates start information and provides the start information to the battery controller 240.

The battery controller 240 checks the startup on the basis of the startup information, and confirms the initial state information detected by the battery sensor 210. That is, the battery sensor 210 detects a voltage value of the battery 150. The battery sensor 210 provides initial state information including the detected voltage value to the storage unit 220, and the storage unit 220 stores initial state information provided from the battery sensor 210. The battery controller 240 checks initial state information stored in the storage unit 220.

The battery controller 240 generates an initial SoC using the voltage value included in the initial state information. In this case, the battery controller 240 checks a control map of the remaining capacity of the battery 150 at a plurality of preset voltages. This control map may be an OCV (Open Circuit Voltage) map. The battery controller 240 generates an initial SoC by extracting the residual capacity matched to the voltage value included in the initial state information based on the control map.

In addition, the vehicle controller 250 may receive the initial SoC from the battery controller 240 to confirm the control, and may control the SoC of the battery 150 to be greater than or equal to the control value during driving.

That is, the vehicle controller 250 may control the charging and discharging of the battery 150 through the alternator 140 such that the SoC of the battery 150 becomes greater than or equal to the first control value while driving. In this case, the first control value may be a value which is a reference value in order to maintain the durability of the battery 150 to the maximum and to help fuel efficiency, and is a preset value. For example, the first control value may be 92%.

In addition, the vehicle controller 250 may control the charging and discharging of the battery 150 through the alternator 140 such that the SoC of the battery 150 becomes greater than or equal to the second control value during driving. In this case, the second control value may be a reference value for improving fuel economy and is a preset value. For example, the second control value may be 86%.

The battery controller 240 generates an internal resistance of the battery 150 by using the voltage value and the current value at start-up at S315.

In other words, the battery controller 240 checks the change values of the current and the voltage from the start of the startup to the completion of the startup based on the initial state information stored in the storage unit 220. Then, the current change value and the voltage change value are generated based on the checked current and voltage change.

The battery controller 240 generates an internal resistance of the battery 150 using the current change value and the voltage change value. That is, the battery controller 240 may generate the internal resistance of the battery 150 through Equation 1 below.

$$IR = \frac{\Delta V}{\Delta I} \quad \text{[Equation 1]}$$

Here, IR may represent an internal resistance, $\Delta V$ may represent a voltage change value, and $\Delta I$ may represent a current change value.

The battery controller 240 determines whether the internal resistance differs from the initial internal resistance by more than the reference value. Here, the initial internal resistance may represent internal resistance generated when the battery 150 is mounted on the vehicle. This initial internal resistance can be stored and managed in the resistance unit.

The battery controller 240 generates battery replacement notification information for inducing the driver to replace the battery when the internal resistance is greater than the reference value relative to the initial internal resistance. In this case, the reference value may be a value generated to inform the battery replacement. The reference value is a preset value and may be set differently according to the type, vehicle type, etc. of the battery 150. For example, the reference value may be 1.5 times.

The battery replacement notification information may be output through the output unit 260 to inform the driver, or may notify the driver when the driver visits a repair shop, a service center, or the like.

The battery controller 240 generates a driving SoC based on driving state information when the vehicle is driving at S320.

In other words, the battery controller 240 checks the current value of the battery 150 based on the driving state information detected by the battery sensor 210 while the vehicle is driving. The battery controller generates a charge current integrated value and a discharge current accumulated value in which the current is accumulated over the time when the current is subtracted from the battery 150 in which current is accumulated for a time when the current is supplied to the battery 150 while the vehicle runs from the time when the start-up is turned on to the time when the driving SoC is generated.

The battery controller 240 generates the driving SoC using the charge current integrated value, the discharge current integrated value battery charging efficiency, and the initial SoC. In this case, the battery charging efficiency may be set differently according to aging of the battery 150, and may be initially set to 1.

That is, the battery controller 240 may generate the driving SoC through Equation 2 below.

$$SoC_d = SoC_i + \frac{\alpha \times Ah_{cha} - Ah_{dis}}{B} \quad \text{[Equation 2]}$$

Here, $SoC_d$ represents the driving SoC, $SoC_i$ represents the initial SoC, a represents the battery charging efficiency, $Ah_{cha}$ represents the integrated charging current value of the battery 150, $Ah_{dis}$ represents the integrated discharge current value of the battery 150 B may represent battery capacity.

The battery controller 240 generates a first SoC based on the driving state information of the battery 150, the battery charging efficiency, and the initial SoC at startup at S325.

Specifically, the battery controller 240 receives the startup information from the startup detector 230 and checks the startup off based on the startup information. The battery controller 240 checks driving state information at startup off. The battery controller 240 generates a charge current integrated value in which current is accumulated for a time when the current is supplied to the battery 150 from the time of starting on to the time of starting off based on the driving state information, and generates a discharge current integrated value in which current is accumulated for a time in which the current is subtracted from the battery 150 from the time of starting on to the time of starting off based on the driving state information.

The battery controller 240 generates the first SoC using the initial SoC, the charge current integration value, the discharge integration integration value, the battery charging efficiency, and the battery capacity.

That is, the battery controller 240 may generate the first SoC through Equation 3 below.

$$SoC_1 = SoC_i + \frac{\alpha \times Ah_{cha} - Ah_{dis}}{B} \quad \text{[Equation 3]}$$

Here, SoC1 represents the first SoC, SoCi represents the initial SoC, a represents the battery charging efficiency, $Ah_{cha}$ represents the charging current integration value, $Ah_{dis}$ represents the discharge current integration value, and B represents the battery capacity.

The battery controller 240 checks the off time by counting the off time after startup at S330.

The battery controller 240 determines whether the off time is greater than or equal to the reference time at S335. In this case, the reference time may indicate a time when the reference voltage is removed to the battery 150. For example, the reference time may be 6 hours.

Meanwhile, when the off time is less than the reference time, the battery controller 240 returns to step S330 to check the off time.

The battery controller 240 generates a second SoC when the off time is greater than or equal to the reference time at S340.

In other words, the battery controller 240 checks off state information detected by the battery sensor 210 and checks the voltage value of the battery 150 included in the off state information.

The battery controller 240 generates a second SoC by extracting the residual capacity matched to the voltage value based on the control map.

The battery controller 240 determines whether a difference value between the first SoC and the second SoC is greater than or equal to a set value at S345. Here, the set value is a value set to determine the deterioration state of the battery 150 and may be a preset value. For example, the set value may be 10%.

Meanwhile, the battery controller 240 controls the alternator 140 by providing the pre-stored battery charging efficiency to the vehicle controller 250 when the difference value is less than the set value.

The battery controller 240 resets the battery charging efficiency if the difference is greater than or equal to the set value at S350.

In other words, when the difference value is greater than or equal to the set value, the battery controller 240 resets the battery charging efficiency using the difference value. That is, the battery controller 240 may reset the battery charging efficiency through Equation 4 below.

$$a=(1-D)a \qquad \text{[Equation 4]}$$

Here, a may represent a battery charging efficiency, and D may represent a difference value.

For example, if the difference between the first SoC and the second SoC is 13%, a=(1−0.13)a=0.87a and thus the battery charging efficiency can be changed from 1 to 0.87.

The battery controller 240 determines whether the reset battery charging efficiency is lower than or equal to the set efficiency. In this case, the setting efficiency may be set in advance as a reference value to inform the battery replacement. The setting efficiency may be set differently according to the type, vehicle type, etc. of the battery 150.

The battery controller 240 generates battery replacement notification information when the battery charging efficiency is less than or equal to the set efficiency. The output unit 260 may notify the driver of battery replacement by outputting battery replacement notification information generated by the battery controller 240.

The vehicle controller 250 controls the alternator 140 based on the battery charging efficiency at S355.

That is, the vehicle controller 250 receives battery charging efficiency from the battery controller 240. The vehicle controller 250 controls the alternator 140 based on the provided battery charging efficiency to adjust the amount of current supplied to the battery 150.

For example, when the battery charging efficiency is 0.87, charging 100 Ah to the battery 150 through the alternator 140 charges 87 Ah due to aging of the battery 150. Therefore, vehicle controller 250 may control alternator 140 to control 113 Ah to charge battery 150.

Meanwhile, the battery controller 240 and the vehicle controller 250 has been described as an example to perform the battery management method according to the present disclosure, but is not limited thereto. For example, it may be performed by the battery controller 240, may be performed by the vehicle controller 250, or may be performed by a separate controller installed in the vehicle.

Figure 4:
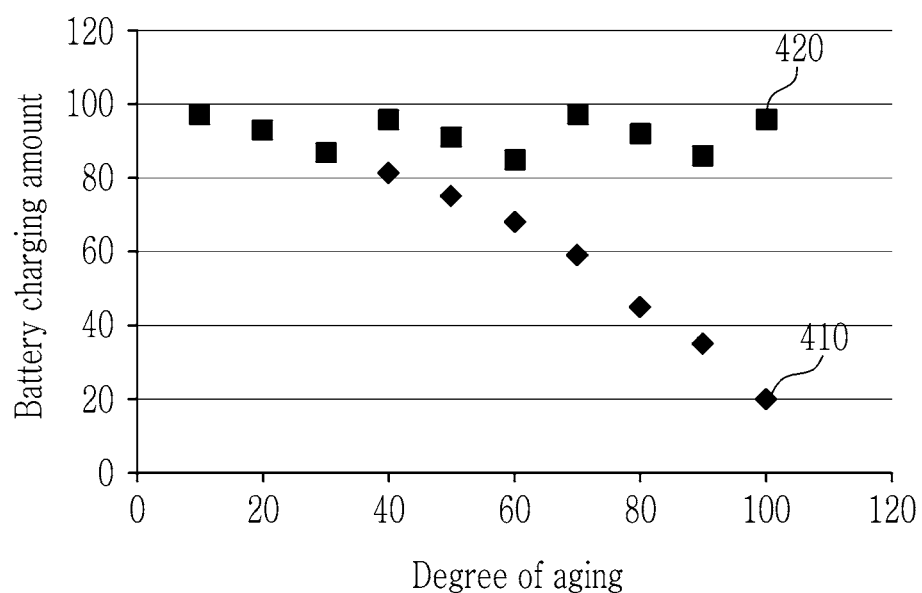
FIG. 4 and FIG. 5 are exemplary views for explaining the effect of the battery management method according to an exemplary embodiment of the present disclosure.
Figure 5:
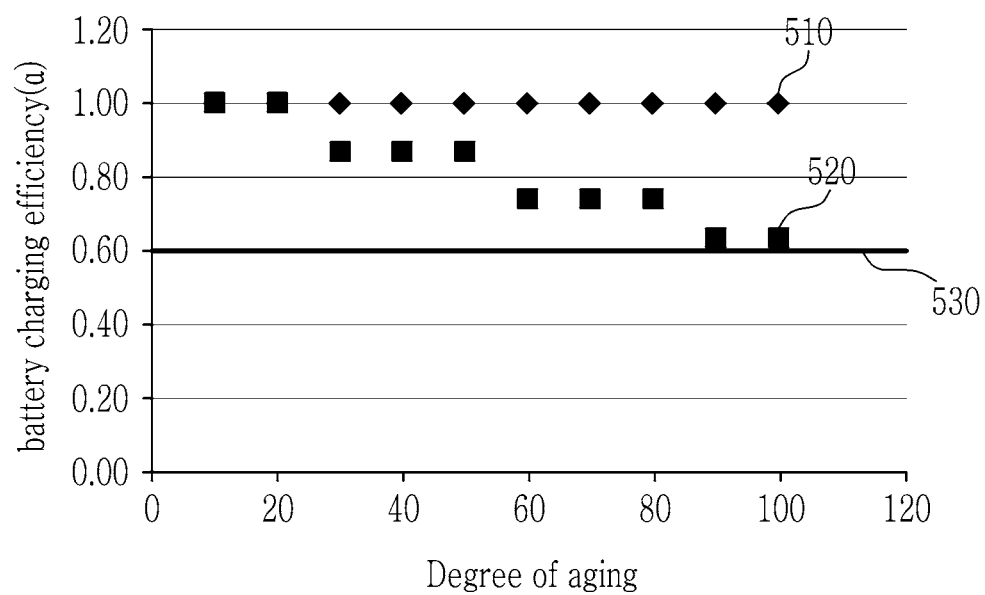

FIG. 4 and FIG. 5 are exemplary views for explaining the effect of the battery management method according to an exemplary embodiment of the present disclosure.

Referring to FIG. 4, in the conventional case 410, as the battery 150 ages, the charge amount of the battery 150 is insufficient. However, when applying the battery management method 420 according to the present disclosure, the state of the battery 150 is monitored to recognize that the battery 150 is aging, and the charging amount of the battery 150 is increased and controlled according to the aging of the battery 150. Therefore, the durability of the battery 150 can be increased.

In addition, referring to FIG. 5, in the conventional case 510, since the battery charging efficiency is set constant, the aging state of the battery 150 may not be confirmed. However, when the battery management method 520 according to the present disclosure is applied, battery charging efficiency may be differently controlled according to aging of the battery 150, and the performance degradation of the battery 150 may be detected. In addition, the present disclosure may notify the driver of the replacement when the set efficiency is less than 530, thereby improving the driver's convenience and preventing the vehicle accident caused by the failure with the battery 150 in advance.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

The invention claimed is:

1. A battery management apparatus for a vehicle for checking a status of aging of the battery and controlling the charging and discharging of the battery according to the status of aging of the battery, comprising:
   a battery for supplying current to a plurality of electric loads mounted on the vehicle;
   an alternator for supplying current to the battery and the plurality of electric loads;
   a battery detection unit for detecting the state information of the battery;
   a battery controller generating an initial state of charge by using initial state information of the battery at startup, generating an internal resistance of the battery using a voltage value and a current value of the battery, generating a first state of charge by using a driving state information of the battery, a battery charging efficiency, and the initial state of charge when the startup is off, generating a second state of charge by using the off state information of the battery when the off time after the start-off is greater than or equal to the reference time, and resetting the battery charging efficiency based on the first state of charge and the second state of charge; and
   a vehicle controller for receiving the battery charging efficiency from the battery controller, and controlling the alternator based on the battery charging efficiency to charge the battery, wherein the battery controller generates an integrated current value while the vehicle is driven based on the current value included in the driving state information when the vehicle is turned off, and generates a first state of charge using the current integrated value, the initial state of charge, and the battery capacity.

2. The battery management apparatus for vehicle of claim 1, wherein:
the battery controller generates a charge current integrated value in which a current is accumulated for a time when the current is supplied to the battery from the time when the start is turned on to the time when the start is turned off, and a discharge current integrated value in which a current is accumulated for a time when the current is subtracted from the battery from the time when the start is turned on to the time when the start is turned off.

3. The battery management apparatus for vehicle of claim 1, wherein:
the battery controller checks a voltage value of the battery included in the off state information when the off time after the start-off is greater than or equal to a set time and generates the second charged state based on the voltage value.

4. The battery management apparatus for vehicle of claim 1, wherein:
the battery controller resets the battery charging efficiency if a difference value between the first state of charge and the second state of charge is equal to or greater than a set value.

5. The battery management apparatus for vehicle of claim 1, wherein:
the battery controller generates battery replacement notification information when the internal resistance is greater than or equal to a reference value compared to an initial internal resistance or the battery charging efficiency is less than or equal to a set efficiency.

6. The battery management apparatus for vehicle of claim 1, further comprising:
an output unit for outputting the battery replacement notification information.

7. The battery management apparatus for vehicle of claim 1, further comprising:
a storage unit storing at least one of state information detected by the battery detector, an initial state of charge, a first state of charge, a second state of charge, and a battery charge efficiency generated by the battery controller.

8. A battery management method for a vehicle including a battery for supplying current to a plurality of electric loads mounted on the vehicle, and an alternator for supplying current generated by power of an engine to the battery and the plurality of electric loads for checking a status of aging of the battery and controlling the charging and discharging of the battery according to the status of aging of the battery, the method comprising:
generating an initial state of charge of the battery using the voltage value after checking a voltage value of the battery at startup;
generating an internal resistance of the battery using the voltage value and the current;
generating a first state of charge by using the initial state of charge, driving state information, and the battery charging efficiency after checking the driving state information of the battery when the startup is off;
determining whether the off time after the start-off is greater than or equal to the reference;

generating a second state of charge using the voltage value after checking a voltage value of the battery when the off time is greater than or equal to the reference time; and
resetting the battery charging efficiency if the difference value is equal to or greater than a set value after checking a difference value between the first state of charge and the second state of charge,
wherein generating a first state of charge includes:
generating an integrated current value from the time when the start is turned on to the time when the start is turned off based on the current value included in the driving state information, and checking a charge time and a discharge time of the battery from the time when the start is turned on to the time when the start is turned off; and
generating the first state of charge by using the initial state of charge, the current integrated value, the charge time of the battery, the discharge time of the battery, and the battery capacity.

9. The battery management method for vehicle of claim 8, wherein:
generating the first state of charge is performed by:

$$SoC_1 = SoC_i + \frac{\alpha \times Ah_{cha} - Ah_{dis}}{B}$$

where $SoC_1$ is the first state of charge, $SoC_i$ is the initial state of charge, $\alpha$ is the battery charging efficiency, $Ah_{cha}$ is a charge current integrated value, $Ah_{dis}$ is a discharge current integrated value, and B is battery capacity.

10. The battery management method for vehicle of claim 8, wherein:
generating a second state of charge includes:
checking a control map of the remaining capacity of the battery at a plurality of preset voltages; and
generating the second state of charge by extracting a residual capacity matched to a voltage value of a battery corresponding to an off time based on the control map.

11. The battery management method for vehicle of claim 8, further comprising:
after generating an internal resistance of the battery, determining whether the internal resistance differs from the initial internal resistance by more than a reference value; and
generating battery replacement notification information when the reference value is different.

12. The battery management method for vehicle of claim 8, further comprising:
after resetting the battery charging efficiency, determining whether the battery charging efficiency is less than or equal to a set efficiency; and
generating battery replacement notification information when the battery charging efficiency is lower than or equal to a set efficiency.

13. The battery management method for vehicle of claim 8, further comprising:
after resetting the battery charging efficiency, controlling the alternator based on the battery charging efficiency to adjust an amount of current supplied to the battery.

* * * * *